United States Patent
Klimke et al.

(10) Patent No.: US 6,804,112 B2
(45) Date of Patent: Oct. 12, 2004

(54) ASSEMBLY WITH A BASE BOARD AND AT LEAST ONE DAUGHTER BOARD

(75) Inventors: Jens Klimke, Berliner Strasse (DE); Christian Ness, Trelleborger Strasse (DE)

(73) Assignee: Tektronix International Sales GmbH, Schaffhausen (CH)

( * ) Notice: Subject to any disclaimer, the term of this patent is extended or adjusted under 35 U.S.C. 154(b) by 0 days.

(21) Appl. No.: 10/290,909

(22) Filed: Nov. 8, 2002

(65) Prior Publication Data

US 2003/0107872 A1 Jun. 12, 2003

(30) Foreign Application Priority Data

Dec. 7, 2001  (EP) .............................................. 01129104

(51) Int. Cl.[7] ................................................. H05K 7/00

(52) U.S. Cl. ....................... 361/685; 361/686; 361/720; 361/724; 361/684

(58) Field of Search ................................. 361/685, 686, 361/684, 687, 748, 726, 800, 719, 801, 760, 720, 736, 759, 740, 732, 747, 816, 818

(56) References Cited

U.S. PATENT DOCUMENTS

| | | | |
|---|---|---|---|
| 4,694,380 A | | 9/1987 | Mallory et al. |
| 4,942,550 A | * | 7/1990 | Murray ........................ 710/301 |
| 6,078,504 A | * | 6/2000 | Miles .......................... 361/727 |
| 6,412,749 B1 | * | 7/2002 | Supinski et al. ............. 248/674 |
| 6,421,252 B1 | * | 7/2002 | White et al. ................. 361/797 |

FOREIGN PATENT DOCUMENTS

| | | |
|---|---|---|
| EP | 0 317 464 | 5/1989 |
| FR | 2 290 127 | 5/1976 |

* cited by examiner

*Primary Examiner*—Randy W. Gibson
*Assistant Examiner*—Hung S. Bui
(74) *Attorney, Agent, or Firm*—Francis I. Gray

(57) ABSTRACT

The present invention relates to an assembly with a base board and at least one daughter board, which base board includes at least a first attachment means for attaching the base board to a mainframe, with the front of the assembly which remains accessible from the exterior after installation of the assembly in the mainframe being of a standardized width, the daughter board being connected to the base board via at least a second attachment means in such a way that an electrically conductive front panel of the daughter board forms at least a portion of the front of the assembly, with at least a portion of the front panel of the daughter board being of the standardized width.

10 Claims, 3 Drawing Sheets

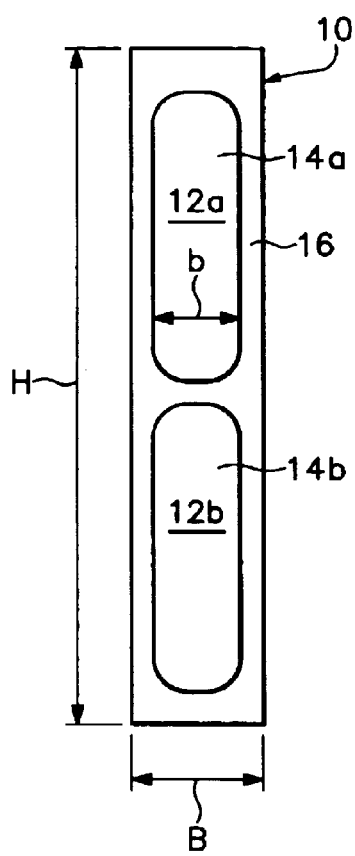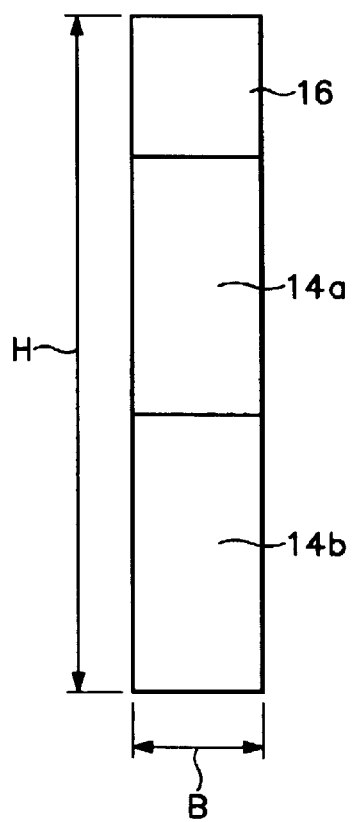
FIG.1
(PRIOR ART)
FIG.4

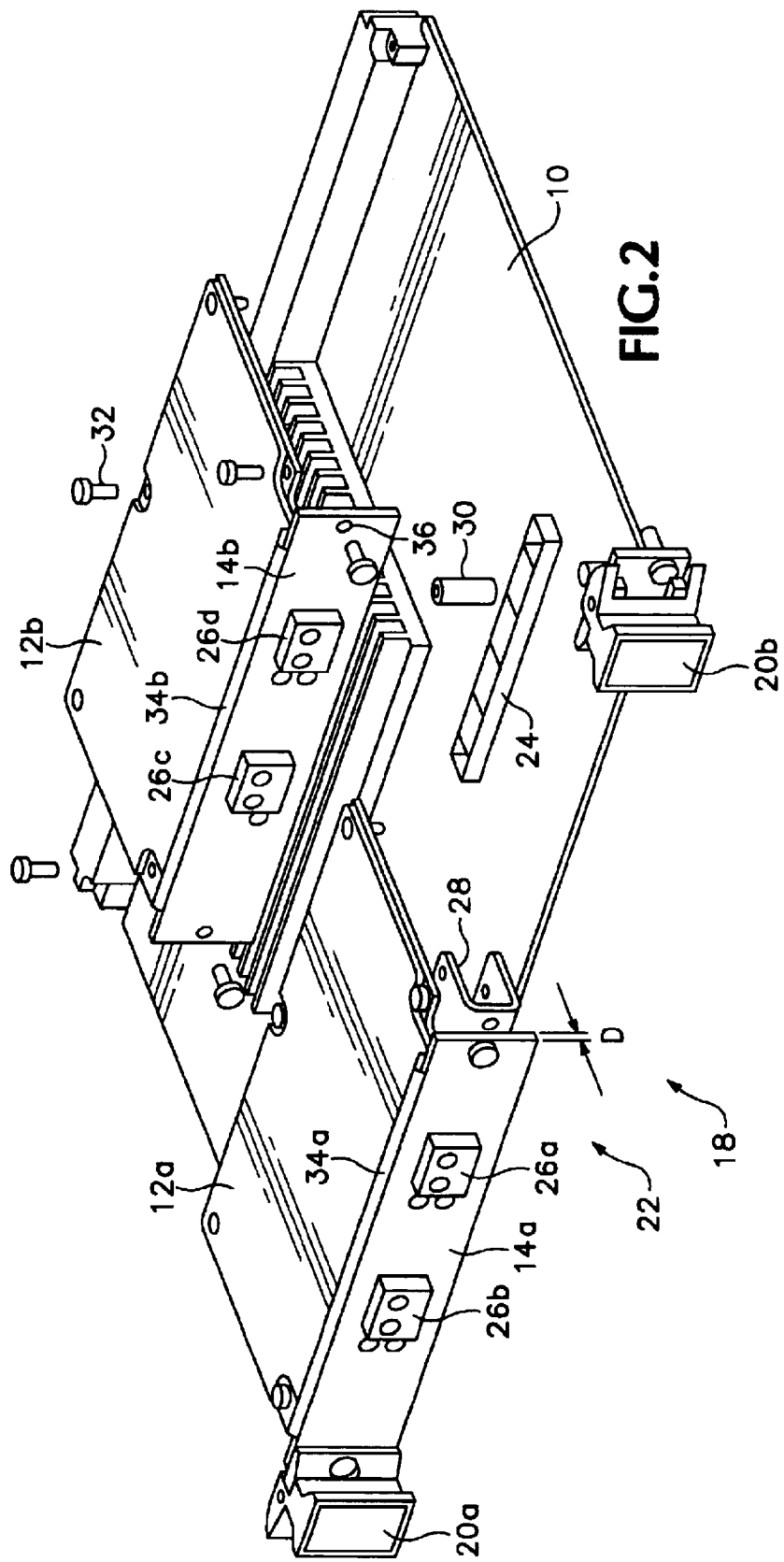

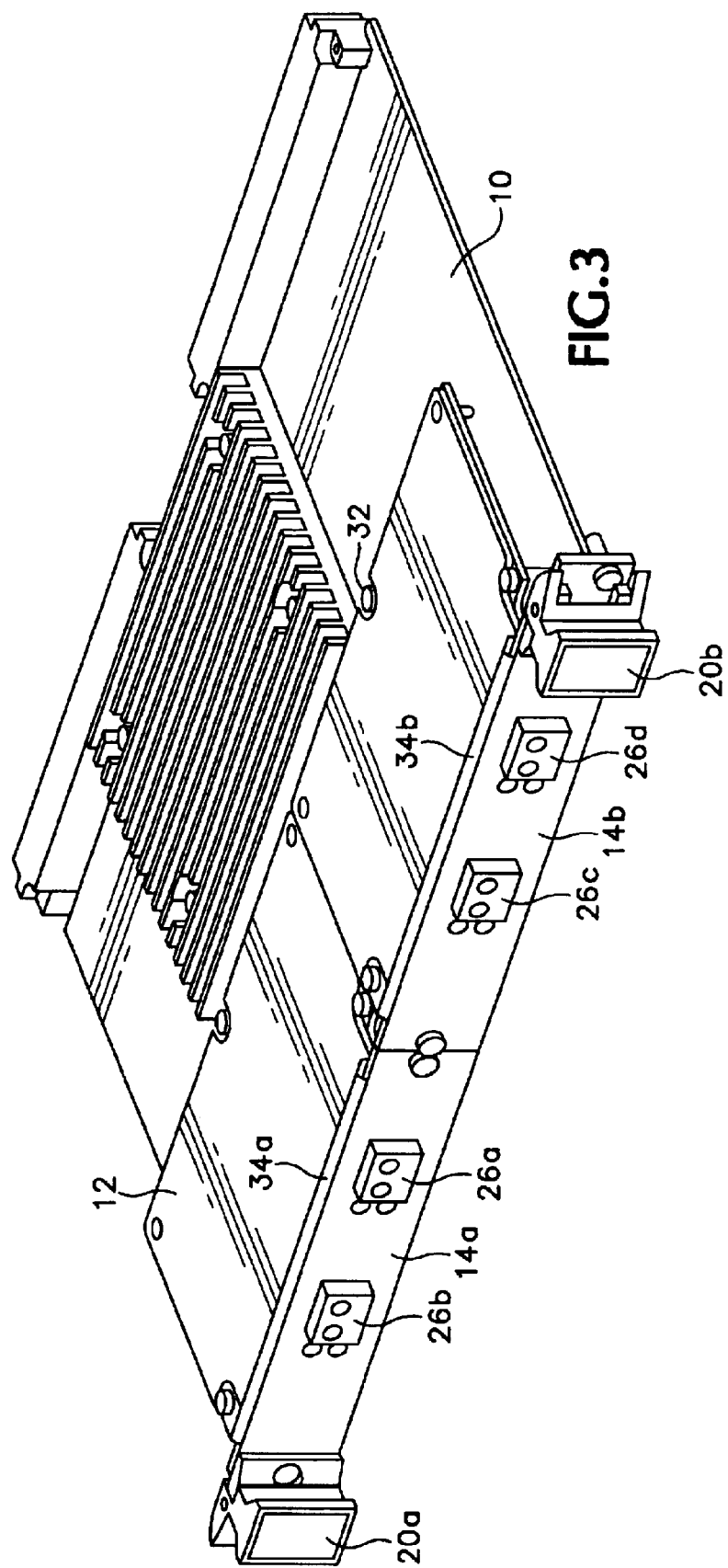

ASSEMBLY WITH A BASE BOARD AND AT LEAST ONE DAUGHTER BOARD

BACKGROUND OF THE INVENTION

The present invention relates to an assembly with a base board and at least one daughter board, in particular an assembly of this kind in which the base board includes at least one attachment means for attaching the base board to a mainframe.

The problem to be solved by the present invention is described in the following with reference to FIG. 1. FIG. 1 is a schematic view of a prior art base board 10 including two daughter boards 12a, 12b of which, however, only the electrically conductive front panels 14a and 14b are shown in the view of FIG. 1. The assembly consisting of the base board 10 and the daughter boards 12a, 12b is of a standardized width B and a standardized height H. These may for example correspond to the IEEE 1101 standard designed for the cPCI bus system or the VME bus.

The shortcoming of this prior art assembly is that the maximum admissible width of the connectors on the daughter boards 12a, 12b is restricted by the width b of the front panel 14a, 14b of the daughter board, which is less than the standardized width B. In such a case, merely installing a conventional BNC connector may already cause problems. Another problem results from the requirement to electrically connect the front panels 14a, 14b to the front 16 of the base board 10. This makes high demands on the manufacturing quality, with regard to the cutting out of the front panel 16 of the base board 10 as well as of the front panels 14a, 14b of the daughter boards 12a, 12b. It is known to insert metallically conductive seals in the gap between the front panel 14a, 14b of the daughter board 12a, 12b and the front panel 16 of the base board 10. However, such seals either have good electricity conducting properties or they are resilient. This makes it difficult to obtain a transition between the front panel 14a, 14b of the daughter boards 12a, 12b and the front panel 16 of the base board 10 which conducts well and seals tightly. Insufficient sealing moreover causes an EMI problem in that electromagnetic radiation may exit through the gaps between the front panels of the daughter board and that of the base board, thus causing interference.

For this reason, it is the object of the present invention to enhance the aforementioned assembly in such a way that it allows the use of as wide as possible connectors on the daughter board while reducing the EMI problem.

BRIEF SUMMARY OF THE INVENTION

This object is accomplished by the present invention by providing an assembly with a base board and at least one daughter board, in particular an assembly of this kind in which the base board includes at least one attachment means for attaching the base board to a mainframe. In this case the front of the assembly, which remains accessible from the exterior once the assembly has been installed in a mainframe, is of a standardized width. The daughter board is connected to the base board via at least a second attachment means in such a way that an electrically conductive daughter board front panel forms at least a portion of the front of the assembly. With the aforementioned assembly, at least a portion of the front panel of the daughter board is of the standardized width.

The present invention is based on the idea that the abovementioned problems can be avoided if the daughter board front panel itself constitutes the assembly front panel at a certain height and along a certain portion. This allows the daughter board front panel to be made as wide as permitted under the standard, for which purpose the same connectors can be chosen for the daughter board as for the base board. The fact that the standardized width is much smaller than the gaps extending in the direction of the height of the prior art assembly clearly reduces the EMI problem.

The fact that the front panel of the daughter board no longer has to be fitted into the front panel of the base board, in particular the edges of the daughter boards can be straight, makes production much easier, which in turn clearly reduces production costs.

In a particularly preferred embodiment, the daughter board front panel is of uniform thickness, except for through-holes and/or EMI flanges. Producing daughter board front panels of uniform thickness is especially simple and thus inexpensive.

It is preferred to have the daughter board front panel coupled to a portion of the base board which constitutes a portion of the front of the assembly via an electrically conducting coupling element. Such a coupling element may be generously designed so that good electrical contact is achieved between the daughter board front panels and the portion of the base board which forms a portion of the front of the assembly. In particular, the rear of the daughter board front panel may for example be used here, in order to make the latter contact the coupling element over a certain area, whereas the prior art only used the contact surfaces which were very small owing to the thickness of the front panel.

The daughter board front panel is preferably connected to the front panel of at least one further daughter board via an electrically conducting coupling element, which at least one further daughter board likewise constitutes a portion of the front of the assembly. In this variant, a coupling element can be used for obtaining an electrically conducting connection between several daughter boards and a portion of the front of the assembly which is constituted by the base board.

The coupling element may be of the U- or block-shaped type. In this case, one side of the U-shaped or block-shaped element may be connected to the base board, with the respective other side thereof being connected to at least one electrically connecting daughter board front panel. In such a design, the coupling element not only serves for obtaining an electrical connection, but also for stably mounting the daughter board on the assembly.

The assembly may especially meet the requirements of a mechanical assembly pursuant to the IEEE 1101 standard.

The side of the daughter board abutting the front of the assembly and facing away from the coupling means may be connected to the base board via a third attachment means. Said third attachment means may be in the form of a bolt, thus providing a simple means for reliably connecting the daughter board to the base board.

In a preferred embodiment, the front panel of the at least one daughter board is of the standardized width over its entire length. This allows the front panel to be made of rectangular shape which will result in a particularly easy manufacture and thus low assembly costs. In this embodiment, each daughter board front panel then forms a height portion of the front of the assembly.

Further advantageous embodiments of the invention can be gathered from the subclaims.

BRIEF DESCRIPTION OF THE SEVERAL VIEWS OF THE DRAWING

In the following, an embodiment of the invention shall now be explained with reference to the accompanying drawings, of which FIG. 1 is a view of a prior art assembly of a base board and two daughter boards.

FIG. 2 is a view of an assembly according to the invention which has one daughter board already connected to it, and another daughter board not yet.

FIG. 3 is a view of the assembly according to the invention as of FIG. 2 which has both daughter boards connected to the base board.

FIG. 4 is a view of an assembly according to a second embodiment.

DETAILED DESCRIPTION OF THE INVENTION

In the FIGS. identical reference symbols or numerals are used throughout to denote identical elements or elements of the same function. FIG. 2 is a view of an assembly 18 comprising a base board 10 and two daughter boards 12a, 12b. The assembly 18 may be installed in a mainframe via attachment means 20a, 20b. Each daughter board 12a, 12b has a front panel 14a, 14b which—once the daughter board 12a, 12b has been installed —forms a portion of the front 22 of the assembly 18. The base board 10 has attachment means 24 in order to connect the daughter boards front panels 14a, 14b mechanically and electrically to the base board 10. Ports 26a through d have exemplarily been drawn into the front panels 14a, 14b of the daughter boards 12a, 12b.

A U-shaped electrically conductive coupling element 28 serves for obtaining conductive connections of the daughter boards 12a, 12b and the base board 10. In the present case, the front panels 14a, 14b of the daughter boards 12a, 12b are furthermore interconnected in an electrically conductive manner via the coupling element 28. The coupling element 28 may take any other suitable form, in particular block form. A bolt 30 and a screw 32 serve to stably and reliably connect the rear of the daughter board 12b to the base board 10. With the exception of EMI flanges 34a, 34b and throughholes, one example of which is marked 36, the front panels 14a, 14b of the daughter boards 12a, 12b are of uniform thickness D over their entire height.

FIG. 3 is a view of the assembly 18 of FIG. 2 after the daughter board 12b is also connected to the base board 10.

As shown in FIG. 4, a portion of the front 22 of the assembly 18 may actually be formed by a front panel 16 of the base board 10 itself. The portion 16 is preferably also of the standardized width B over its entire length. One or plural daughter boards may be connected to this portion, likewise by means of coupling elements 28. In the embodiment shown in FIG. 4, the topmost portion of the front of the assembly is thus constituted by the front panel 16 of the base board 10, while the two subsequent portions are constituted by the daughter board front panels 14a, 14b. Of course, the invention may also be implemented with plural daughter boards as well as plural base board front panels.

What is claimed is:

1. An assembly having a front panel of a standardized width formed by respective electrically conducting front panel portions of a base board and a daughter board, the assembly also including a first attachment means for attaching the base board to a mainframe, further comprising a second attachment means for attaching the daughter board to the base board such that the electrically conducting front panel portions form respective adjacent portions of the front panel of the assembly, the respective electrically conducting front panel portions being of the standardized width, and such that the electrically conducting front panel portion of the daughter board is electrically coupled to the base board to prevent electromagnetic radiation from exiting through gaps between the respective electrically conducting front panel portions.

2. The assembly as claimed in claim 1 wherein the electrically conducting front panel portion of the daughter board is of uniform thickness, with the exception of throughholes and/or EMI flanges.

3. The assembly as claimed in claims 1 or 2 wherein the electrically conducting front panel portion of the daughter board is connected to the electrically conducting front panel portion of the base board via the second attachment means.

4. The assembly as claimed in claim 3 wherein the second attachment means comprises an electrically conducting coupling element.

5. The assembly as claimed in claim 4 wherein the electrically conducting front panel portion of the daughter board is connected to an electrically conducting front panel portion having the standardized width of an adjacent daughter board via the electrically conducting coupling element, the electrically conducting front panel portion of the adjacent daughter board forming another adjacent portion of the front panel of the assembly.

6. The assembly as claimed in claim 4 wherein the electrically coupling element has a shape selected from the group consisting of a U-shape and a block shape.

7. The assembly as claimed in claim 6 wherein one side of the electrically coupling element is connected to the base board and another side of the electrically coupling element is connected to the electrically conducting front panel portion of the daughter board.

8. The assembly as claimed in claim 3 wherein the daughter board includes a port for input and/or output signals.

9. The assembly as claimed in claim 3 wherein a side of the daughter board abutting the front panel of the assembly and facing away from the electrically coupling element is connected to the base board via a third attachment means.

10. The assembly as claimed in claim 3 wherein the first attachment means comprises attachment means for mechanically and electrically connecting the base board to the mainframe.

\* \* \* \* \*